(12) United States Patent
Kim et al.

(10) Patent No.: US 11,151,933 B2
(45) Date of Patent: Oct. 19, 2021

(54) DISPLAY DEVICE

(71) Applicant: Samsung Display Co., Ltd., Yongin-Si (KR)

(72) Inventors: Jaeneung Kim, Seoul (KR); Jinbo Shim, Yongin-si (KR); Jung-Moo Hong, Seongnam-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/796,565

(22) Filed: Feb. 20, 2020

(65) Prior Publication Data

US 2020/0342806 A1 Oct. 29, 2020

(30) Foreign Application Priority Data

Apr. 29, 2019 (KR) .......................... 10-2019-0049957

(51) Int. Cl.
*G09G 3/3225* (2016.01)
*G06F 3/044* (2006.01)
*H01L 27/32* (2006.01)
*H01L 51/52* (2006.01)
*H01L 27/12* (2006.01)

(52) U.S. Cl.
CPC ......... *G09G 3/3225* (2013.01); *G06F 3/0446* (2019.05); *H01L 27/323* (2013.01); *H01L 27/3248* (2013.01); *H01L 51/5234* (2013.01); *G06F 2203/04102* (2013.01); *G09G 2300/0421* (2013.01); *G09G 2310/08* (2013.01); *H01L 27/124* (2013.01); *H01L 27/3276* (2013.01)

(58) Field of Classification Search
CPC ......... G09G 3/3225; G09G 2300/0421; G09G 2310/08; G06F 3/0446; G06F 2203/04102; G06F 2203/04107; G06F 3/0443; G06F 3/04164; G06F 1/1643; G06F 1/1686; G06F 1/1652; H01L 27/323; H01L 27/3248; H01L 27/3276; H01L 51/5232; H01L 27/124; H01L 27/3262; H01L 27/3279; H01L 27/3246; H01L 51/5234

See application file for complete search history.

(56) References Cited

U.S. PATENT DOCUMENTS

| | | | |
|---|---|---|---|
| 9,046,975 B2* | 6/2015 | Kang | G06F 3/0446 |
| 10,347,699 B2* | 7/2019 | Kwon | H01L 27/323 |
| 10,642,390 B2* | 5/2020 | Lee | G06F 3/0443 |
| 10,698,523 B2* | 6/2020 | Jang | H01L 27/3262 |
| 10,727,450 B2* | 7/2020 | Yun | H01L 51/0097 |

(Continued)

FOREIGN PATENT DOCUMENTS

| KR | 10-2017-0136687 A | 12/2017 |
|---|---|---|
| KR | 10-2017-0142243 A | 12/2017 |

(Continued)

*Primary Examiner* — Michael J Jansen, II
(74) *Attorney, Agent, or Firm* — Innovation Counsel LLP

(57) ABSTRACT

Provided is a display device including a display panel and an input sensing layer. The input sensing layer includes an input sensor and a plurality of input sensing lines. The display panel includes a base layer, a circuit layer including a plurality of clock signal lines, a first electrode disposed between the clock signal lines and first input sensing lines and having a plurality of second holes defined therein, and a second electrode overlapping at least one of the clock signal lines in a plan view, thereby achieving uniform input sensitivity.

19 Claims, 10 Drawing Sheets

(56) References Cited

U.S. PATENT DOCUMENTS

| | | | |
|---|---|---|---|
| 10,763,857 B2* | 9/2020 | Kim .................... | H03K 17/962 |
| 2005/0264689 A1* | 12/2005 | Yang .................... | G06F 1/1605 |
| | | | 348/373 |
| 2013/0300678 A1* | 11/2013 | Kang .................... | G06F 3/0446 |
| | | | 345/173 |
| 2016/0218151 A1* | 7/2016 | Kwon ................ | H01L 27/3276 |
| 2017/0353181 A1* | 12/2017 | Kim ........................ | G06F 3/044 |
| 2017/0364194 A1* | 12/2017 | Jang .................... | H01L 27/3262 |
| 2018/0032189 A1* | 2/2018 | Lee ........................ | G06F 3/0443 |
| 2018/0033830 A1* | 2/2018 | Kim .................... | G06F 3/0443 |
| 2018/0183015 A1* | 6/2018 | Yun .................... | H01L 51/0097 |

FOREIGN PATENT DOCUMENTS

| KR | 10-2018-0014396 A | 2/2018 |
|---|---|---|
| KR | 10-1905789 B1 | 10/2018 |

\* cited by examiner

DISPLAY DEVICE

CROSS-REFERENCE TO RELATED APPLICATIONS

This U.S. non-provisional patent application claims priority under 35 U.S.C. § 119 to Korean Patent Application No. 10-2019-0049957, filed on Apr. 29, 2019, the entire contents of which are hereby incorporated by reference.

BACKGROUND

The present disclosure herein relates to a display device, and more specifically, to a display device providing uniform input sensitivity.

Various display devices used for multimedia devices such as a television, a mobile phone, a tablet computer, a navigation system, a game machine are being developed. Display devices include a keyboard, a mouth, or the like as an input device. In addition, in recent years, display devices are provided with an input sensing layer as an input device.

SUMMARY

An embodiment of the inventive concept provides a display device including a display panel for displaying an image, and an input sensing layer disposed on the display panel. The input sensing layer may be disposed on the display panel and may include an input sensor and a plurality of input sensing lines electrically connected to the input sensor. The display panel may include a base layer, a circuit layer, a light emitting element layer, a first electrode, and a second electrode. The base layer may include a display region and a non-display region. The circuit layer may include a pixel circuit layer disposed on the display region of the base layer and a driving circuit layer disposed on the non-display region of the base layer, including a power electrode and a plurality of clock signal lines and providing a driving signal for driving the pixel circuit layer. The light emitting element layer may include a pixel electrode disposed on the pixel circuit layer and electrically connected to the pixel circuit layer, a light emitting layer disposed on the pixel electrode, and a common electrode disposed on the light emitting layer and extended toward the non-display region from the display region. The first electrode may be disposed between the plurality of clock signal lines and the plurality of input sensing lines, and may have a plurality of second holes defined therein. The second electrode may overlap at least one of the plurality of clock signal lines in a plan view.

In an embodiment, the at least one of the plurality of clock signal lines may include a clock signal line that is disposed farthest from the display region and the second electrode may completely overlap the clock signal line that is disposed farthest from the display region in a plan view.

In an embodiment, the second electrode may be provided in plurality. In an embodiment, the plurality of second electrodes may cover the plurality of second holes in a one-to-one correspondence.

In an embodiment, the first electrode may electrically connect the power electrode and the common electrode.

In an embodiment, the display panel may further include a pixel defining film which is disposed on the pixel electrode and exposes at least a portion of the pixel electrode. The second electrode may be disposed on the pixel defining film to overlap the pixel defining film in a plan view.

In an embodiment, the second electrode may be spaced apart from the first electrode with the pixel defining film interposed therebetween.

In an embodiment, the first electrode may be disposed on the same layer with the pixel electrode. In an embodiment, the second electrode may have conductivity. In an embodiment, the second electrode may include a transparent conductive layer. In an embodiment, the display panel may further include a thin film encapsulation layer disposed on the light emitting element layer. In an embodiment, the input sensing layer may be disposed directly on the thin film encapsulation layer.

In an embodiment, in the display device, a first hole passing through the display panel and the input sensing layer may be defined. The first hole may be surrounded by the display region in a plan view.

In an embodiment, the plurality of second holes may be filled with an insulation material.

In an embodiment of the inventive concept, a display device may include a base layer, a circuit layer, a light emitting element layer, a pixel defining film, and a second electrode. The base layer may have a display region and a non-display region defined thereon. The circuit layer may include a driving circuit layer which is disposed on the base layer and includes a power electrode and a plurality of clock signal lines, and a pixel circuit layer. The light emitting element layer may be disposed on the circuit layer and may include a pixel electrode, a light emitting layer, and a common electrode sequentially laminated. The pixel defining film may be disposed on the pixel electrode and exposes at least a portion of the pixel electrode. The second electrode may be disposed on the pixel defining film and may overlap at least one of the plurality of clock signal lines in a plan view.

In an embodiment, the display device may further include a first electrode electrically connecting the power electrode and the common electrode and overlapping at least some of the plurality of clock signal lines. The first electrode may have a plurality of second holes defined therein, and the second electrode overlaps the plurality of second holes in a plan view.

In an embodiment, the first electrode may have a plurality of second holes defined thereon, and the second electrode may overlap the plurality of second holes on the plane. In an embodiment, the second electrode may be provided in plurality. The second electrodes may respectively correspond to the plurality of second holes in a one-to-one correspondence. In an embodiment, the display device may further include a thin film encapsulation layer disposed on the common electrode.

In an embodiment, the display device may further include an input sensing layer. The input sensing layer may be directly disposed on the thin film encapsulation layer, and may include an input sensor and a plurality of input sensing lines electrically connected to the input sensor.

In an embodiment, the second electrode may be disposed between the input sensing lines and the plurality of clock signal lines.

In an embodiment, the second electrode may include a transparent conductive layer.

In an embodiment, the display device may further include at least one first hole passing through the display region of the base layer.

In an embodiment, the second electrode may completely overlap a clock signal line that is disposed farthest from the display region.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
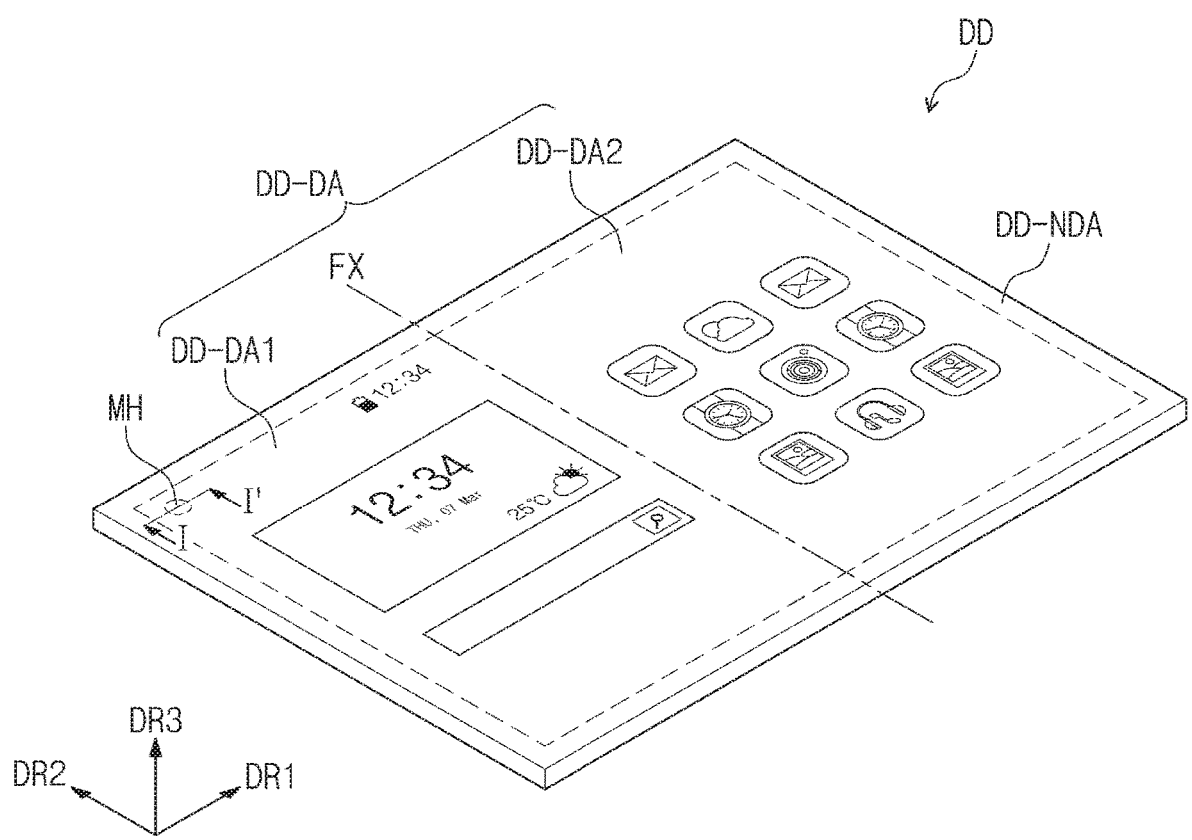
FIG. 1 is a perspective view of a display device according to an embodiment of the inventive concept.

In the present disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents.

The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. The terms of a singular form may include the terms of a plural form unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the inventive concept pertains. It is also to be understood that terms defined in commonly used dictionaries may be interpreted as having meanings consistent with the meanings in the context of the related art, and are interpreted as being expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, exemplary embodiments of the inventive concept will be described with reference to the accompanying drawings.

FIG. 1 is a perspective view of a display device DD according to an embodiment of the inventive concept. The display device DD according to the inventive concept may be used in a large-sized electronic device such as a television and a monitor and in a small-and-medium-sized electronic device and the like such as a mobile phone, a tablet computer, a car navigation system, a game machine, and a smart watch.

The display device DD may have a display region DD-DA and a non-display region DD-NDA defined thereon.

The display device DD may be folded along a folding axis FX which extends along a second direction DR2 intersecting a first direction DR1. That is, the display device DD may be referred to as a foldable display device.

The display device DD may display an image through the display region DD-DA. In FIG. 1, as an example of an image, a watch window and application icons are illustrated. Hereinafter, the display region DD-DA on the left side of the folding axis FX may be referred to as a first display region DD-DA1 and the display region DD-DA on the right side of the folding axis FX may be referred to as a second display region DD-DA2. The first display region DD-DA1 and the second display region DD-DA2 may be adjacent to each other in the first direction DR1.

In FIG. 1, the folding axis FX is exemplarily illustrated as passing through the center of the display device DD and extending along the second direction DR2. In addition, in FIG. 1, the area of the first display region DD-DA1 and the area of the second display region DD-DA2 are exemplarily illustrated as being the same. However, the inventive concept is not limited thereto. The position of the folding axis FX may be defined closer to one side edge, and in this case, the area of the first display region DD-DA1 and the area of the second display region DD-DA2 may be different from each other.

The display device DD which is not folded, that is, the display device DD is unfolded to have a flat surface, may be referred to as a first state, an unfolded state. In the first state, each of the first display region DD-DA1 and the second display region DD-DA2 of the display device DD may be parallel to a plane defined by the first direction DR1 and the second direction DR2.

In an embodiment of the inventive concept, a first hole MH may be defined in the display region DD-DA. The first hole MH may be surrounded by the display region DD-DA. An electronic module (not shown) may overlap the first hole MH in a plan view. The electronic module may receive an external input through the first hole MH, or may provide an output through the first hole MH.

In the present embodiment, when the display device DD is in the first state, a front surface (or an upper surface) and a back surface (or a lower surface) of each member are defined on the basis of a direction in which an image is displayed. The front surface and the back surface oppose each other in a third direction DR3 and the normal direction of each of the front surface and the back surface may be parallel to the third direction DR3. Meanwhile, the directions indicated by the first to third directions DR1, DR3, and DR3 are relative concepts, and may be altered to different directions. Hereinafter, first to third directions are the directions indicated by the first to third directions DR1, DR2, and DR3, respectively, and are given the same reference numerals as the corresponding ones.

Figure 2:
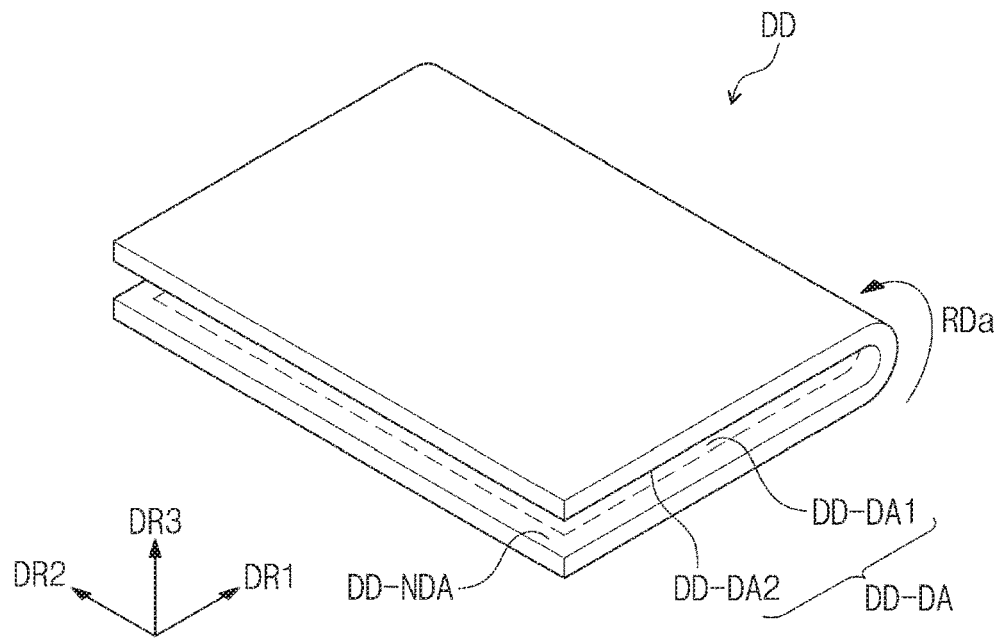
FIG. 2 is a perspective view of a display device according to an embodiment of the inventive concept.

FIG. 2 is a perspective view of a display device according to an embodiment of the inventive concept.

Referring to FIG. 1 and FIG. 2, the display device DD may be folded along the folding axis FX. FIG. 2 shows the display device DD when it is folded. The state in which the display device DD is completely folded as shown in FIG. 2 may be referred to as a second state, a folded-in state.

The folded-in state may be a state in which the first display region DD-DA1 and the second display region DD-DA2 are folded so as to face each other. Accordingly, in a completely folded-in state, the first display region DD-DA1 and the second display region DD-DA2 may not be visible from the outside.

When the display device DD is transformed from the first state, the unfolded state, to the second state, the folded-in state, a portion of the display device DD including the second display region DD-DA2 may rotate along a first rotation direction RDa with respect to another portion of the display device DD including the first display region DD-DA1.

Figure 3:
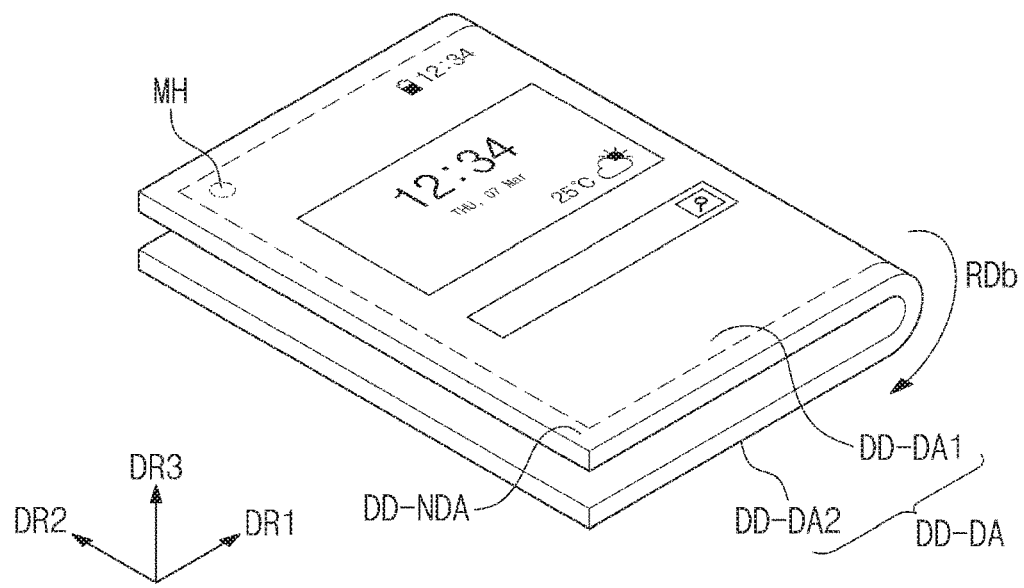
FIG. 3 is a perspective view of a display device according to an embodiment of the inventive concept.

FIG. 3 is a perspective view of a display device according to an embodiment of the inventive concept.

Referring to FIG. 1 and FIG. 3, the display device DD may be folded along the folding axis FX to expose the display region DD-DA to the outside, a folded-out state. FIG. 3 shows the display device DD which is folded-out. The state in which the display device DD is completely folded as shown in FIG. 3 may be referred to as a third state.

The folded-out state may be a state in which the first display region DD-DA1 and the second display region DD-DA2 are folded so as not to face each other. Accordingly, in a completely folded state, the first display region DD-DA1 and the second display region DD-DA2 may be visible from the outside.

When the display device DD is transformed from the first state to the third state, the folded out state, a portion of the display device DD including the second display region DD-DA2 may rotate along a second rotation direction RDb with respect to another portion of the display device DD including the first display region DD-DA1. The second rotation direction RDb may be the opposition direction of the first rotation direction RDa described with reference to FIG. 2.

Figure 4:
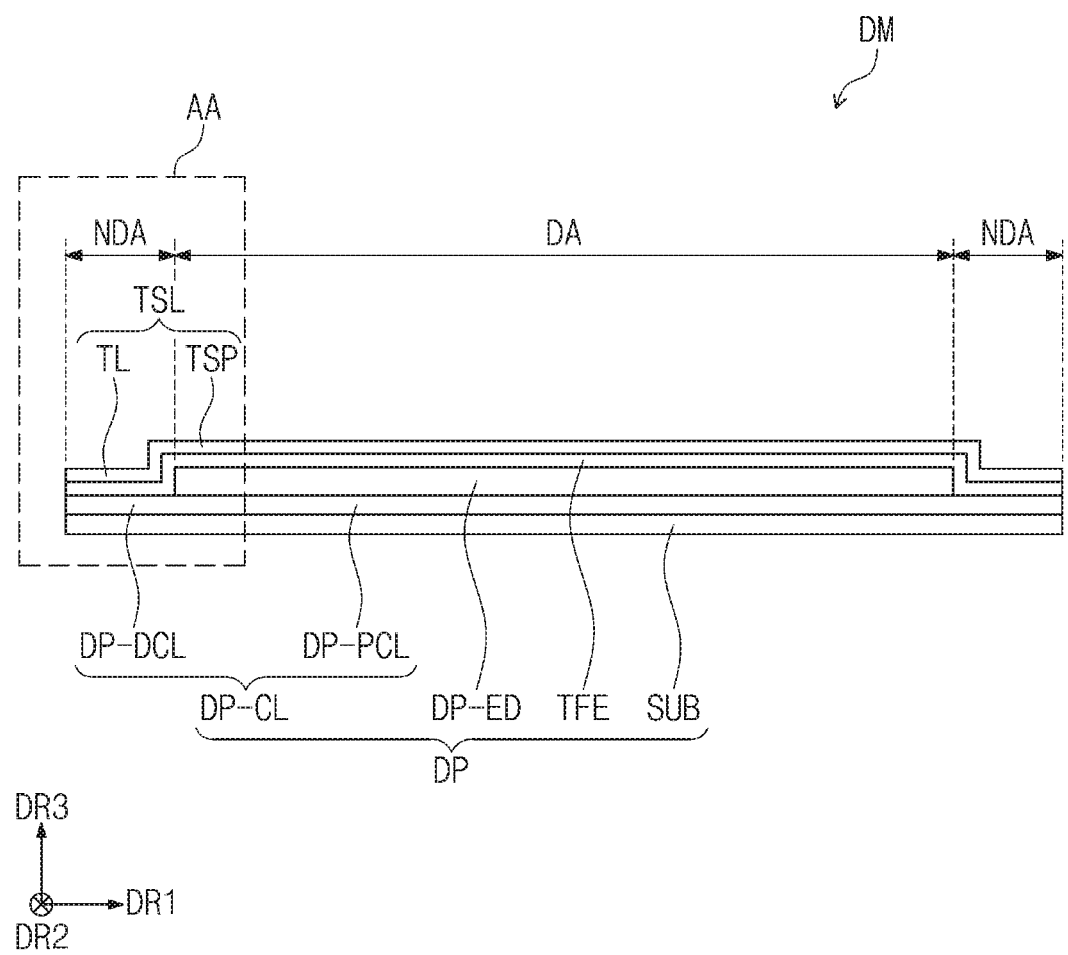
FIG. 4 is a cross-sectional view of a display module according to an embodiment of the inventive concept.
Figure 5:
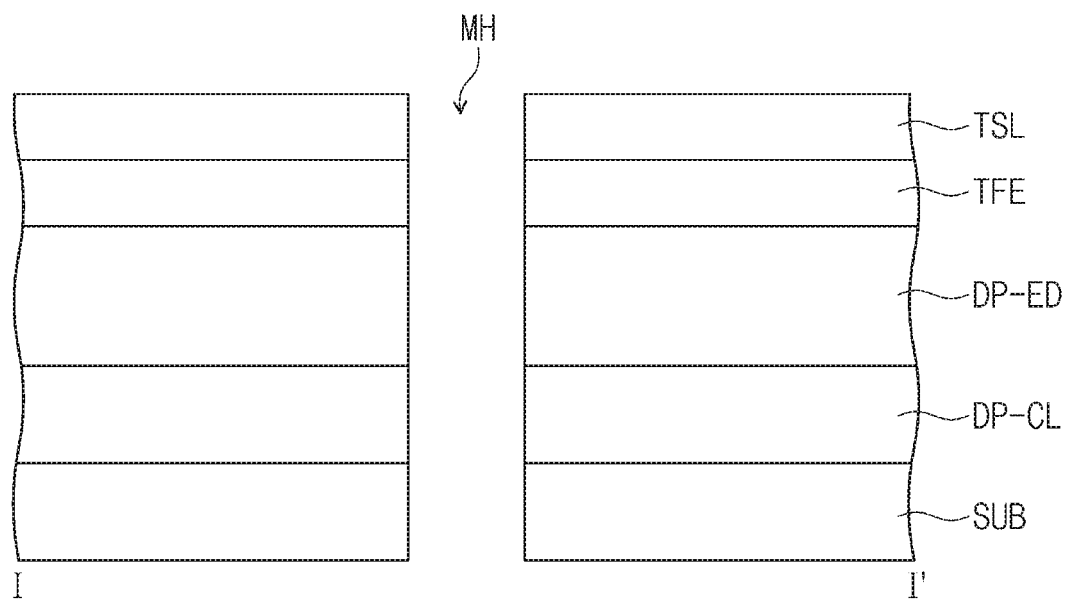
FIG. 5 is a cross-sectional view of a display module according to an embodiment of the inventive concept.
Figure 6:
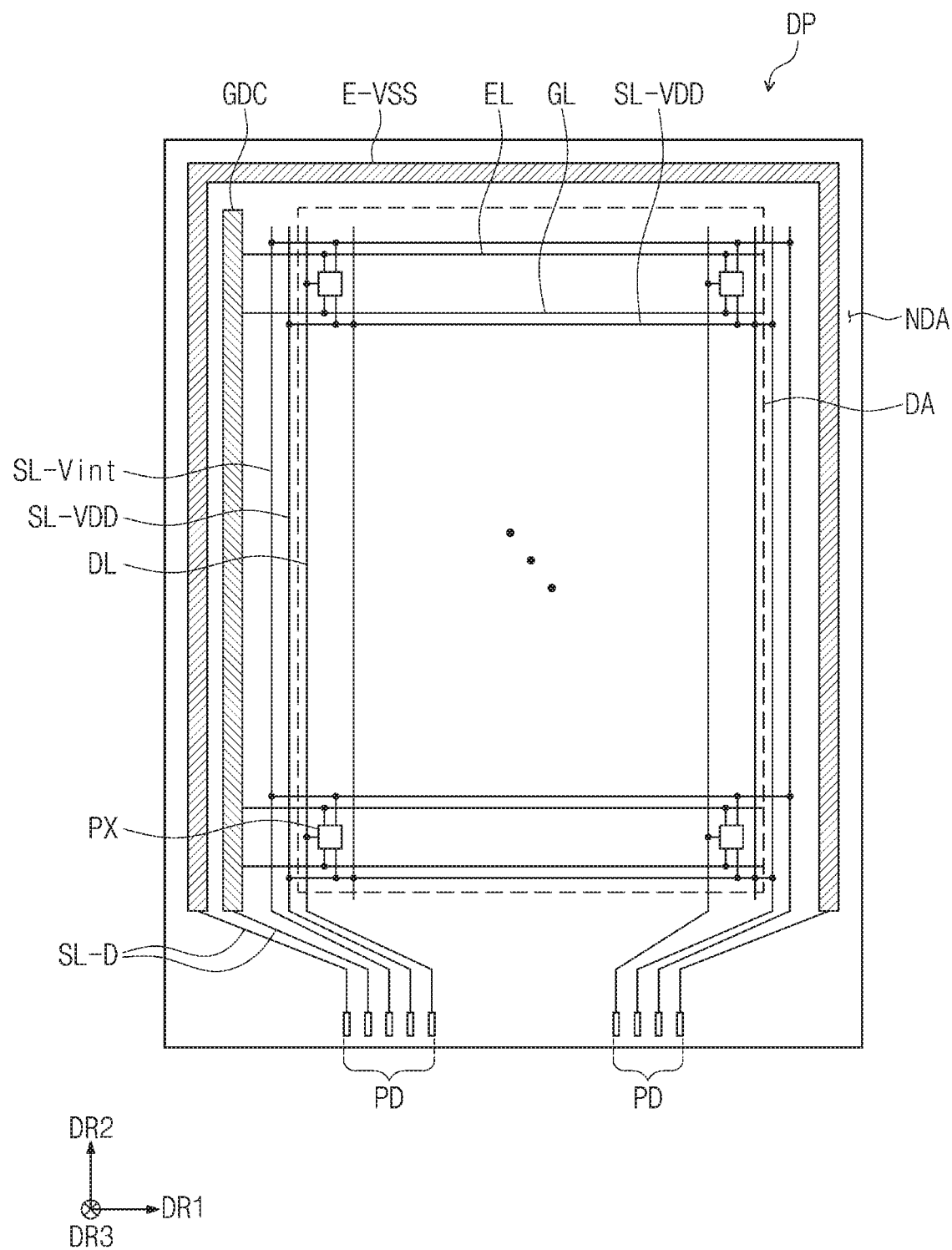
FIG. 6 is a plan view of a display panel according to an embodiment of the inventive concept.
Figure 7:
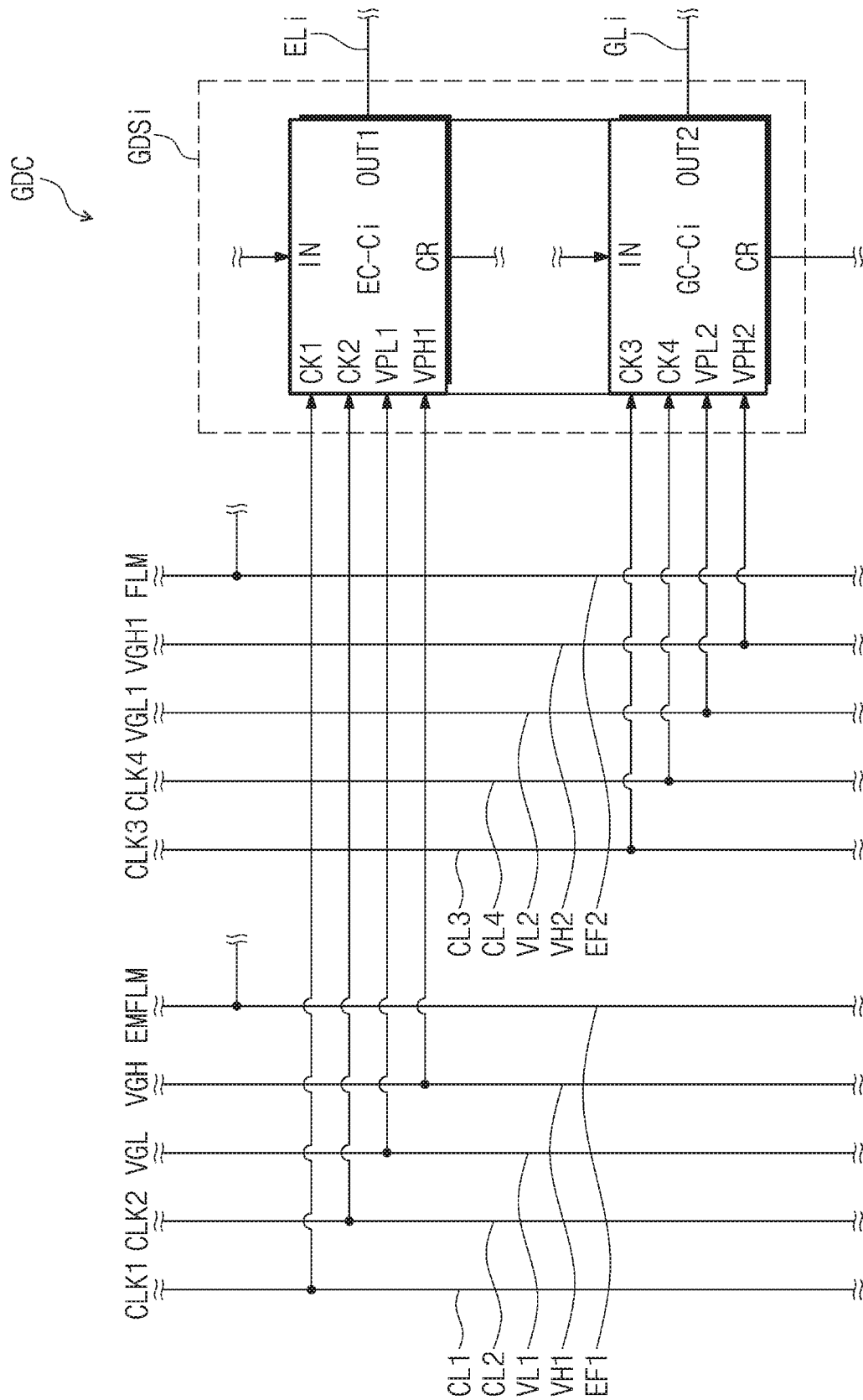
FIG. 7 is a block diagram of a gate driving circuit and a driving stage according to an embodiment of the inventive concept.

FIG. 4 is a cross-sectional view of a display module DM according to an embodiment of the inventive concept. FIG. 5 is a cross-sectional view of the display module DM according to an embodiment of the inventive concept. FIG. 6 is a plan view of a display panel DP according to an embodiment of the inventive concept. FIG. 7 is a block diagram of a gate driving circuit GDC and a driving stage GDSi according to an embodiment of the inventive concept.

Referring to FIG. 4 and FIG. 5, the display panel DP includes a base layer SUB, a circuit layer DP-CL disposed on the base layer SUB, a light emitting element layer DP-ED, and a thin film encapsulation layer TFE.

The display panel DP includes a display region DA and a non-display region NDA in a plan view. The display region DA and the non-display region NDA of the display panel DP respectively correspond to the display region DD-DA (FIG. 1) and the non-display region DD-NDA (FIG. 1) of the display device DD (FIG. 1). The display region DA and the non-display region NDA of the display panel DP may not be necessarily the same as the display region DD-DA (FIG. 1) and the non-display region DD-NDA (FIG. 1) of the display device DD (FIG. 1), and may be altered according to the structure and design of the display panel DP.

In the present specification, "in a plan view" may mean when viewed from the third direction DR3.

The base layer SUB may include at least one plastic film. The base layer SUB is a flexible substrate, and may include a plastic substrate, a glass substrate, a metal substrate, or an organic/inorganic composite material substrate. The plastic substrate may include at least one among an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

The circuit layer DP-CL may be disposed on the base layer SUB. The circuit layer DP-CL may include a plurality of insulation layers, a plurality of conductive layers, and a semiconductor layer. The plurality of conductive layers of the circuit layer DP-CL may constitute signal lines or a pixel control circuit. The circuit layer DP-CL may include a pixel circuit layer DP-PCL disposed in the display region DD-DA and a driving circuit layer DP-DCL disposed in the non-display region DD-NDA.

Figure 9:
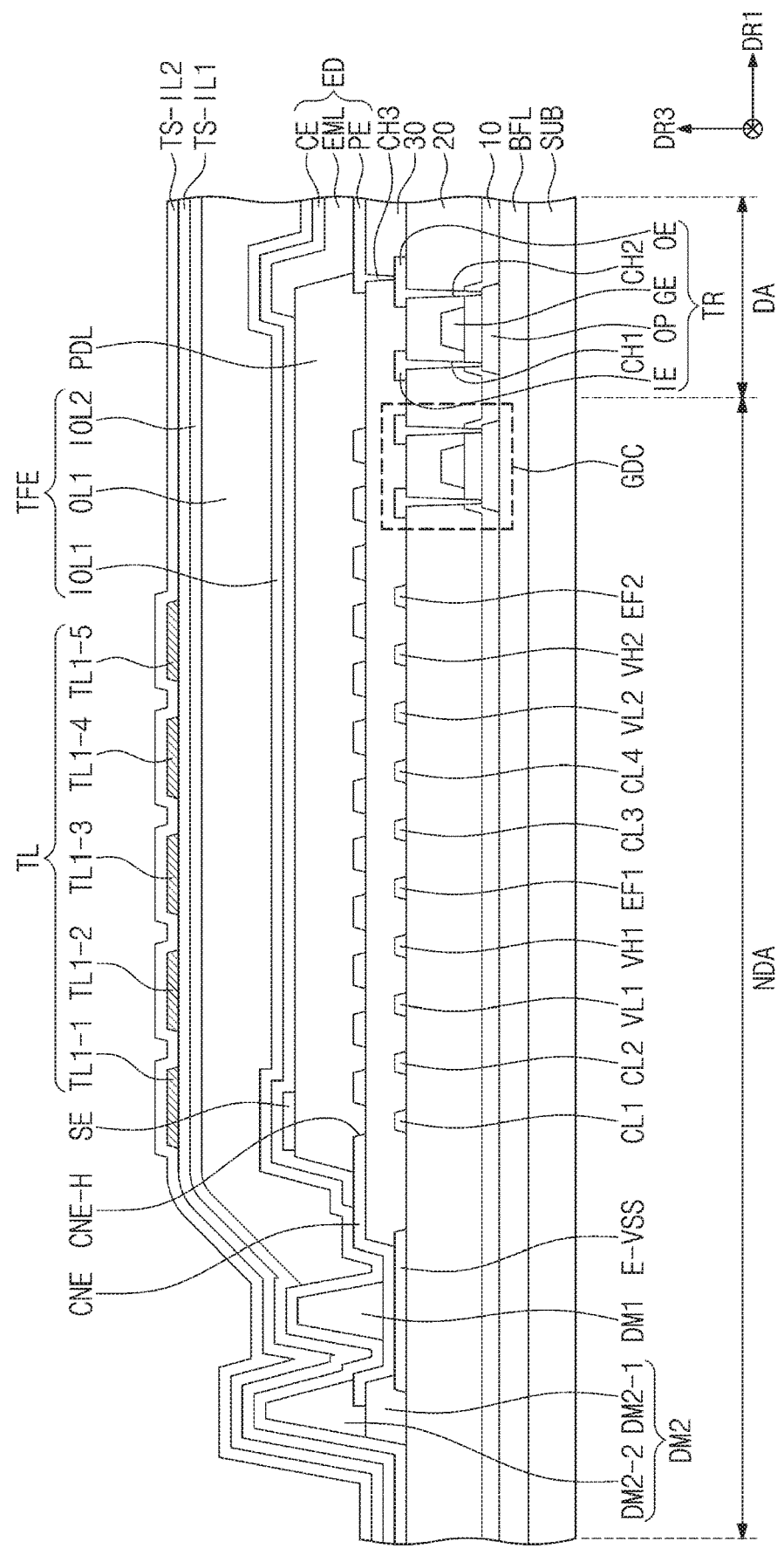
FIG. 9 is an enlarged cross-sectional view illustrating an enlarged view of region AA of FIG. 4.

The light emitting element layer DP-ED may be disposed on the circuit layer DP-CL. The light emitting element layer DP-ED includes a plurality of light emitting elements ED (FIG. 9).

The thin film encapsulation layer TFE may be disposed on the circuit layer DP-CL and the light emitting element layer DP-ED. The thin film encapsulation layer TFE may encapsulate the circuit layer DP-CL and the light emitting element layer DP-ED. The thin film encapsulation layer TFE may include a plurality of inorganic thin films and at least one organic thin film disposed between the plurality of inorganic thin films. The inorganic thin films protect the light emitting element layer DP-ED from moisture/oxygen and the organic thin film protects the light emitting element layer DP-ED from foreign materials such as dust particles.

An input sensing layer TSL is disposed on the thin film encapsulation layer TFE. The input sensing layer TSL may be disposed directly on the encapsulation layer TFE. However, the embodiment of the inventive concept is not limited thereto. A protection layer may be disposed on the thin film encapsulation layer TFE, and the input sensing layer TSL may be disposed directly on the protection layer. The protection layer may be an inorganic layer or an organic layer. The inorganic layer may include at least one among silicon nitride, silicon oxynitride, or silicon oxide. The organic layer may include a polymer. However, this is only exemplary, and the embodiment of the inventive concept is not limited thereto. Although the protection layer is described as being a separate component, the protection layer may be a component included in the thin film encapsulation layer TFE.

The input sensing layer TSL includes an input sensor TSP and input sensing lines TL. The input sensor TSP and the input sensing lines TL may have a single-layered structure or a multi-layered structure. The input sensor TSP and the input sensing lines TL may include a transparent conductive material such as indium tin oxide (ITO), indium zinc oxide (IZO), zinc oxide (ZnO), indium tin zinc oxide (ITZO), PEDOT, metal nanowires, or graphene. The input sensor TSP and the input sensing lines TL may include a metal layer formed of, for example, molybdenum, silver, titanium, copper, aluminum, or an alloy thereof. The input sensor TSP and the input sensing lines TL may have the same layer structure, or different layer structures. Details of the input sensing layer TSL will be described later.

FIG. 5 is a cross-sectional view of a region corresponding to a region in which the first holes MH is disposed. Referring to FIG. 5, the first hole MH may pass through the display panel DP and the input sensing layer TSL. The first hole MH may be defined as a region in which components of the display panel DP and components of the input sensing layer TSL are all removed therefrom.

Meanwhile, in the present embodiment, the first hole MH is illustrated as being in a cylindrical shape having a height in the third direction DR3, but is not limited thereto. The first hole MH may be provided in various shapes such as a polygonal column, an elliptical column, a cone, or the like, but is not limited to any one embodiment.

The electronic module (not shown) may be disposed below the display panel DP or may be disposed in the first hole MH. The electronic module may be a module having a size that may be received in the first hole MH, or may be a module having at least a size similar to that of the first hole MH. For example, the electronic module (not shown) may be a camera.

Referring to FIG. 6, the display panel DP includes a plurality of pixels PX. A region in which the plurality of pixels PX are disposed is defined as the display region DA. In the present embodiment, the non-display region NDA may be disposed along the edge of the display region DA.

The display panel DP includes gate lines GL, data lines DL, light emitting lines EL, control signal lines SL-D, an initialization voltage line SL-Vint, a voltage line SL-VDD, a power electrode E-VSS, and pads PD.

The gate lines GL are respectively connected to a corresponding pixel PX among the plurality of pixels PX, and the data lines DL are respectively connected to a corresponding pixel PX among the plurality of pixels PX. Each of the light emitting lines EL may be arranged side-by-side to extend parallel to a corresponding gate line GL among the gate lines GL. The control signal line SL-D may provide control signals to the gate driving circuit GDC. The initialization voltage line SL-Vint may provide an initialization voltage to the plurality of pixels PX. The voltage line SL-VDD is connected to the plurality of pixels PX, and may provide a first voltage to the plurality of pixels PX. The voltage line SL-VDD may include a plurality of lines extending in the first direction DR1 and a plurality of lines extending in the second direction DR2. The power electrode E-VSS is disposed in the non-display region NDA, and may be disposed to surround three side surfaces of the display region DA. The power electrode E-VSS may provide a common voltage (for example, a second voltage) to the plurality of pixels PX. The common voltage may be a voltage of a level lower than that of the first voltage.

On one side of the non-display region NDA, the gate driving circuit GDC to which the gate lines GL and the light emitting lines EL are connected may be disposed.

The pads PD may be connected to ends of the data lines DL, the control signal lines SL-D, the initialization voltage line SL-Vint, and the voltage line SL-VDD.

Referring to FIG. 4 and FIG. 7, the circuit layer DP-CL may include a plurality of insulation layers, a plurality of conductive layers, and a semiconductor layer. The plurality of conductive layers of the circuit layer DP-CL may constitute a control circuit of signal lines or of a pixel. The circuit layer DP-CL may include the pixel circuit layer DP-PCL disposed in the display region DA and the driving circuit layer DP-DCL disposed in the non-display region NDA. The pixel circuit layer DP-PCL may include the gate lines GL, the data lines DL, the light emitting lines EL, the initialization voltage line SL-Vint, the voltage line SL-VDD, and the pixels PX described with reference to FIG. 6.

The driving circuit layer DP-DCL may include the power electrode E-VSS, the gate driving circuit GDC, and the control signal line SL-D. The control signal line SL-D may include a first clock signal line CL1, a second clock signal line CL2, a third clock signal line CL3, a fourth clock signal line CL4, a first voltage line VL1, a second voltage line VH1, a third voltage line VL2, a fourth voltage line VH2, a first start signal line EF1, and a second start signal line EF2 which are illustrated in FIG. 7. Among the components, the first clock signal line CL1, the second clock signal line CL2, the third clock signal line CL3, and the fourth clock signal line CL4 may be collectively referred to as clock signal lines.

In FIG. 7, among the plurality of driving stages of the gate driving circuit GDC, the driving stage GDSi connected to the $i^{th}$ gate line GLi and the $i^{th}$ light emitting line ELi is exemplarily illustrated.

The driving stage GDSi may include a light emission control stage EC-Ci and a gate driving stage GC-Ci. The light emission control stage EC-Ci may be provided with light emission control signals CLK1, CLK2, VGL, VGH, and EMFLM through the first clock signal line CL1, the second clock signal line CL2, the first voltage line VL1, the second voltage line VH1, and the first start signal line EF1. The gate driving stage GC-Ci may be provided with gate control signals CLK3, CLK4, VGH1, VGL1, and FLM through the third clock signal line CL3, the fourth clock signal line CL4, the third voltage line VL2, the fourth voltage line VH2, and the second start signal line EF2.

In the present embodiment, one driving stage GDSi including the light emission control stage EC-Ci and the gate driving stage GC-Ci is exemplarily illustrated. However, the embodiment of the inventive concept is not limited thereto. For example, the light emission control stage EC-Ci and the gate driving stage GC-Ci may be included in driving stages different from each other.

The light emission control stage EC-Ci may include a first clock terminal CK1, a second clock terminal CK2, a first voltage input terminal VPL1, a second voltage input terminal VPH1, an input terminal IN, a carry terminal CR, and an output terminal OUT1.

The first clock terminal CK1 receives a first clock signal CLK1, and the second clock terminal CK2 receives a second clock signal CLK2. The first clock signal CLK1 and the second clock signal CLK2 may be signals having different phases. The second clock signal CLK2 may be a signal that is inverted from the phase of the first clock signal CLK1 or a signal that is delayed in phase.

The first voltage input terminal VPL1 receives a first voltage VGL, and the second voltage input terminal VPH1 receives a second voltage VGH. The voltage level of the first voltage VGL may be lower than the voltage level of the second voltage VGH.

The input terminal IN may receive a carry signal of a previous light emission control stage (for example, EC-C$_{i-1}$ (not shown)), and the carry terminal CR may output a carry signal to a following light emission control stage (for example, EC-C$_{i+1}$ (not shown)). The output terminal OUT1 may provide a light emission control signal generated from the light emission control stage EC-Ci to the light emitting line ELi.

A start signal EMFLM may be input to the input terminal IN of the first light emission control stage (for example, EC-C1 (not shown)) among light emission control stages.

The gate driving stage GC-Ci may include a third clock terminal CK3, a fourth clock terminal CK4, a third voltage input terminal VPL2, a fourth voltage input terminal VPH2, an input terminal IN, a carry terminal CR, and an output terminal OUT2.

The third clock terminal CK3 receives a third clock signal CLK3, and the fourth clock terminal CK4 receives a fourth clock signal CLK4. The third clock signal CLK3 and the fourth clock signal CLK4 may be signals having different phases. The fourth clock signal CLK4 may be a signal that is inverted from the phase of the third clock signal CLK3 or a signal that is delayed in phase.

The third voltage input terminal VPL2 receives a third voltage VGL1, and the fourth voltage input terminal VPH2 receives a fourth voltage VGH1. The voltage level of the third voltage VGL1 may be lower than the voltage level of the fourth voltage VGH1.

The input terminal IN may receive a carry signal of a previous gate driving stage (for example, GC-C$_{i+1}$ (not shown)), and the carry terminal CR may output a carry signal to a following gate driving stage (for example, GC-C$_{i+1}$ (not shown)). The output terminal OUT2 may provide a gate signal generated from the gate driving stage GC-Ci to the gate line GLi.

A start signal FLM may be input to the input terminal IN of the first gate driving stage (for ex GC-C1 (not shown)) among gate driving stages.

In an embodiment of the inventive concept, any one among the first clock terminal CK1, the second clock terminal CK2, the first voltage input terminal VPL1, the second voltage input terminal VPH1, the input terminal IN, the carry terminal CR, and the output terminal OUT1 of the light emission control stage EC-Ci may be omitted, or other terminals may be further included. For example, the carry terminal CR may be omitted.

In an embodiment of the inventive concept, any one among the third clock terminal CK3, the fourth clock terminal CK4, the third voltage input terminal VPL2, the fourth voltage input terminal VPH2, the input terminal IN, the carry terminal CR, and the output terminal OUT2 of the gate driving stage GC-Ci may be omitted, or other terminals may be further included. For example, the carry terminal CR may be omitted.

In addition, in FIG. 7, the input terminal IN of the light emission control stage EC-Ci and the input terminal IN of the gate driving stage GC-Ci connected to each of carry terminals of previous stages are exemplarily illustrated. However, the embodiment of the inventive concept is not limited thereto. The connection between driving stages may be variously changed.

Figure 8:
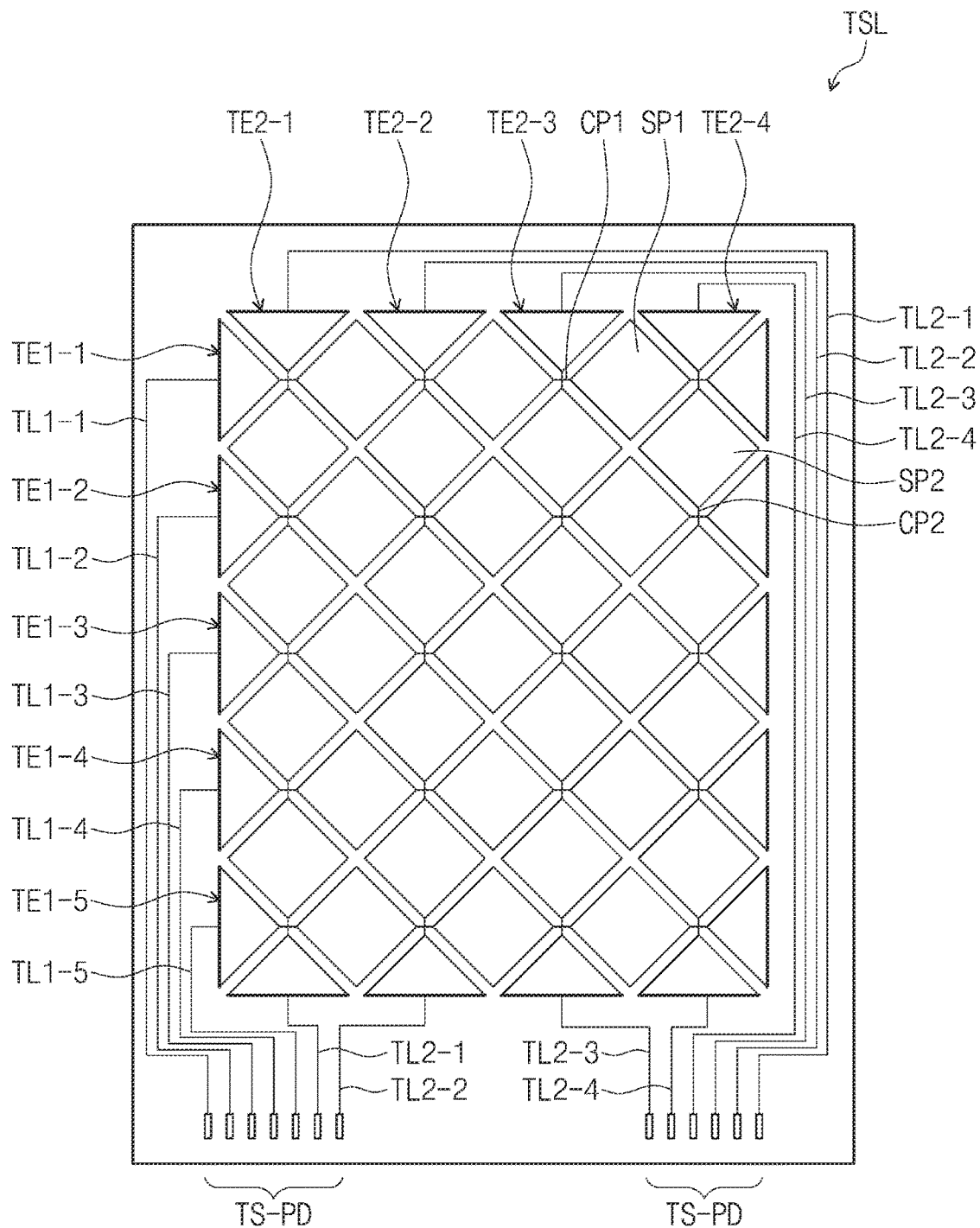
FIG. 8 is a plan view of an input sensing layer according to an embodiment of the inventive concept.
Figure 8:
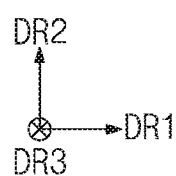

FIG. 8 is a plan view of the input sensing layer TSL according to an embodiment of the inventive concept.

As shown in FIG. 8, the input sensing layer TSL may include the input sensor TSP and a plurality of input sensing lines TL. The input sensing layer TSL may sense an external input by a mutual capacitance method or a self-capacitance method. The input sensor TSP may include first touch electrodes TE1-1 to TE1-5 and second touch electrodes TE2-1 to TE2-4. The input sensing lines TL (FIG. 4) may include first input sensing lines TL1-1 to TL1-5 electrically connected to the first touch electrodes TE1-1 to TE1-5 and second input sensing lines TL2-1 to TL2-4 electrically connected to the second touch electrodes TE2-1 to TE2-4. The first input sensing lines TL1-1 to TL1-5 and the second input sensing lines TL2-1 to TL2-4 may be electrically connected to sensing signal pads TS-PD.

The first touch electrodes TE1-1 to TE1-5 and the second touch electrodes TE2-1 to TE2-4 cross each other. The first touch electrodes TE1-1 to TE1-5 are arranged in the second direction DR2 and each thereof is in a shape extending in the first direction DR1. The second touch electrodes TE2-1 to TE2-4 are arranged in the first direction DR1 and each thereof is in a shape extending in the second direction DR2.

Each of the first touch electrodes TE1-1 to TE1-5 includes first sensor SP1 and first connection lines CP1. Each of the second touch electrodes TE2-1 to TE2-4 includes second sensor SP2 and second connection lines CP2. Among five first sensor SP1, two first sensor disposed at both ends may have a smaller size than a first sensor disposed in the center, for example, may have half the size thereof. Among six second sensor SP2, two second sensor disposed at both ends may have a smaller size than a second sensor disposed in the center, for example, may have half the size thereof.

In FIG. 8, the first touch electrodes TE1-1 to TE1-5 and the second touch electrodes TE2-1 to TE2-4 according to an embodiment are illustrated. However, the shape thereof is not limited to the shape illustrated. For example, in an embodiment of the inventive concept, the first touch electrodes TE1-1 to TE1-5 and the second touch electrodes TE2-1 to TE2-4 may have a shape in which a sensor and a connection line are not distinguished from each other.

The first sensor SP1 are arranged along the first direction DR1, and the second sensor SP2 are arranged along the second direction DR2. Each of the first connection lines CP1 connects the first sensor SP1 adjacent to each other, and each of the second connection lines CP2 connects the second sensor SP2 adjacent to each other.

The first input sensing lines TL1-1 to TL1-5 are connected to one end of the first touch electrodes TE1-1 to TE1-5, respectively. The second input sensing lines TL2-1 to TL2-4 are connected to both ends of the second touch electrodes TE2-1 to TE2-4. In an embodiment of the inventive concept, the first input sensing lines TL1-1 to TL1-5 may also be connected to both ends of the first touch electrodes TE1-1 to TE1-5. In an embodiment of the inventive concept, the second input sensing lines TL2-1 to TL2-4 may be connected to only one end of the second touch electrodes TE2-1 to TE2-4.

FIG. 9 is an enlarged cross-sectional view illustrating an enlarged view of region AA of FIG. 4.

Referring to FIG. 9, a buffer layer BFL may be disposed on the base layer SUB. The buffer layer BFL improves the adhesion between the base layer SUB and conductive patterns or semiconductor patterns. The buffer layer BFL may include an inorganic layer. Although not separately shown, a barrier layer for preventing foreign materials from entering may be further disposed on an upper surface of the base layer SUB. The buffer layer BFL and the barrier layer may be selectively disposed or omitted.

The pixel circuit layer DP-PCL (FIG. 4) may include a plurality of transistors. In FIG. 9, one transistor TR among the plurality of transistors is illustrated. The transistor TR may include a semiconductor pattern OP, a control electrode GE, an input electrode IE, and an output electrode OE. On the buffer layer BFL, the semiconductor pattern OP may be disposed. The semiconductor pattern OP may include at least one among amorphous silicon, polysilicon, and a metal oxide.

On the semiconductor pattern OP, a first insulation layer 10 may be disposed. In FIG. 9, the first insulation layer 10 is exemplarily illustrated as being provided in the form of a layer covering the semiconductor pattern OP. However, the embodiment of the inventive concept is not limited thereto.

The first insulation layer 10 may include a plurality of inorganic thin films. The plurality of inorganic thin films may include a silicon nitride layer, a silicon oxynitride layer, a silicon oxide layer or a combination thereof.

On the first insulation layer 10, the control electrode GE of the transistor TR may be disposed. The control electrode GE may be manufactured according to the same photolithography process as that of the gate lines GL (FIG. 6).

On the first insulation layer 10 and the control electrode GE, a second insulation layer 20 covering the control electrode GE may be disposed. The second insulation layer 20 may provide a flat surface. The second insulation layer 20 may include an organic material and/or an inorganic material.

On the second insulation layer 20, the input electrode IE and the output electrode OE of the transistor TR may be disposed. The input electrode IE and the output electrode OE are respectively connected to the semiconductor pattern OP through a first through-hole CH1 and a second through-hole CH2 passing through the first insulation layer 10 and the second insulation layer 20.

Meanwhile, in another embodiment of the inventive concept, the transistor TR may be transformed into a bottom gate structure and implemented.

On the second insulation layer 20, the power electrode E-VSS and the plurality of signal lines described with reference to FIG. 7 may be disposed. Specifically, on the second insulation layer 20, the power electrode E-VSS, the first clock signal line CL1, the second clock signal line CL2, the third clock signal line CL3, the fourth clock signal line CL4, the first voltage line VL1, the second voltage line VH1, the third voltage line VL2, the fourth voltage line VH2, the first start signal line EF1, and the second start signal line EF2 may be disposed.

On the second insulation layer 20, the input electrode IE, the output electrode OE, and a third insulation layer 30 for covering the plurality of signal lines CL1, CL2, CL3, CL4, VL1, VH1, VL2, VH2, EF1, and EF2 may be disposed. The third insulation layer 30 may cover a portion of the power electrode E-VSS. The third insulation layer 30 includes an organic layer and/or an inorganic layer. Particularly, the third insulation layer 30 may include an organic material in order to provide a flat surface.

Any one of the first insulation layer 10, the second insulation layer 20, and the third insulation layer 30 may be omitted according to the circuit structure of a pixel. Each of the second insulation layer 20 and the third insulation layer 30 may be defined as an interlayer. The interlayer is disposed between conductive patterns to insulate the conductive patterns.

On the third insulation layer 30, a pixel defining film PDL and a light emitting element ED may be disposed. In the display region DA, the light emitting element ED may be disposed. The light emitting element ED may include a pixel electrode PE, a light emitting layer EML, and a common electrode CE which are sequentially laminated.

On the third insulation layer 30, the pixel electrode PE may be disposed. The pixel electrode PE may be electrically connected to the pixel circuit layer DP-PCL. For example, the pixel electrode PE may be connected to the output electrode OE through a third through-hole CH3 passing through the third insulation layer 30.

The pixel defining film PDL may be disposed on the third insulation layer 30. The pixel defining film PDL covers at least a portion of the pixel electrode PE, and may expose another portion of the pixel electrode PE. The light emitting layer EML may be disposed on the pixel electrode PE. The light emitting layer EML may include an organic light emitting material. However, the embodiment of the inventive concept is not limited thereto. The light emitting layer EML may include an inorganic material as a light emitting material. For example, a quantum dot may be included as a light emitting material.

The common electrode CE may be disposed on the light emitting layer EML. The common electrode CE may be electrically connected to the power electrode E-VSS. The common electrode CE may receive a power voltage from the power electrode E-VSS. The common electrode CE may extend toward the non-display region NDA from the display region DA. The common electrode CE may be disposed between the input sensing lines TL and the plurality of clock signal lines CL1, CL2, CL3, and CL4 (hereinafter, CL). Of the common electrode CE, a portion extending toward the non-display region NDA may be disposed on the pixel defining film PDL.

Although not shown, between the pixel electrode PE and the light emitting layer EML, at least one among a hole injection layer (not shown), a hole transport layer (not shown), or an electron blocking layer (not shown) may be disposed. Between the light emitting layer EML and the common electrode CE, at least one among an electron injection layer (not shown), an electron transport layer (not shown), or a hole blocking layer (not shown) may be disposed. A hole and an electron respectively injected from the pixel electrode PE and the common electrode CE of the light emitting element ED meet to form an exciton, and when the exciton falls to a ground state, light may be emitted.

On the light emitting element ED, the thin film encapsulation layer TFE may be disposed. The thin film encapsulation layer TFE may be disposed directly on the light emitting element ED. In FIG. 9, the thin film encapsulation layer TFE is illustrated as being directly disposed on the common electrode CE. However, the embodiment of the inventive concept is not limited thereto. For example, the light emitting element ED may further include a capping layer (not shown) disposed on the control electrode CE. The capping layer (not shown) may be an optical function layer for controlling the refractive index of light emitted from the light emitting layer EML, or controlling the resonance distance of light. In this case, the thin film encapsulation layer TFE may be disposed directly on the capping layer (not shown).

The thin film encapsulation layer TFE may have a multi-layered structure in which a first inorganic thin film IOL1, a first organic thin film OL1, and a second inorganic thin film IOL2 are included. The first inorganic thin film IOL1, the first organic thin film OL1, and the second inorganic thin film IOL2 may each independently have a single-layered structure or a multi-layered structure. However, the embodiment of the inventive concept is not limited thereto. The thin film encapsulation layer TFE may further include an organic thin film and an inorganic thin film.

The input sensing layer TSL may be disposed on the thin film encapsulation layer TFE. The input sensing layer TSL may be disposed directly on the encapsulation layer TFE. The input sensing layer TSL may include a first input insulation layer TS-IL1 disposed below the input sensing lines TL and a second input insulation layer TS-IL2 covering the input sensing lines TL. Although not shown, below the first input insulation layer TS-IL1, some components of each of the first touch electrodes TE1-1 to TE1-5 (see FIG. 8) and the second touch electrodes TE2-1 to TE2-4 (see FIG. 8) may be disposed. For example, below the first input insulation layer TS-IL1, first connection lines CP1 (see FIG. 8) may be disposed, and between the first input insulation layer TS-IL1 and the second input insulation layer TS-IL2, the second connection lines CP2 (see FIG. 8), the first sensor SP1, and the second sensor SP2 may be disposed.

On the non-display region NDA, a first dam portion DM1 and a second dam portion DM2 may be disposed. The first dam portion DM1 and the second dam portion DM2 may be disposed surrounding the display region DA in a plan view. When an organic monomer is printed to form the organic thin film OL1 of the thin film encapsulation layer TFE, the organic monomer may overflow. At this time, the first dam portion DM1 and the second dam portion DM2 may prevent the organic monomer from overflowing.

The first dam portion DM1 may be disposed on the power electrode E-VSS. The first dam portion DM1 may be formed of a single layer, and the first dam portion DM1 may be formed simultaneously with the pixel defining film PDL.

The second dam portion DM2 may be disposed at the outer periphery of the first dam portion DM1. For example, the distance between the first dam portion DM1 and the display region DA may be greater than the distance between the second dam portion DM2 and the display region DA.

The second dam portion DM2 may cover a portion of the power electrode E-VSS. The second dam portion DM2 may be formed of a plurality of layers and the second dam portion DM2 may include a first layer DM2-1 and a second layer DM2-2. The first layer DM2-1 may be formed simultaneously with the third insulation layer 30, and the second layer DM2-2 may be formed simultaneously with the pixel defining film PDL.

The common electrode CE and the power electrode E-VSS may be electrically connected to each other through a first electrode CNE. That is, the first electrode CNE may serve as a connection electrode which electrically connects the common electrode CE and the power electrode E-VSS. The first electrode CNE may be disposed overlapping the non-display region NDA. The first electrode CNE may be disposed between the power electrode E-VSS and the first dam portion DM1. The first electrode CNE may be disposed directly on the power electrode E-VSS. The first electrode CNE may be disposed to extend toward the display region DA between the third insulation layer 30 and the pixel defining film PDL. The first electrode CNE may be disposed on the same layer with the pixel electrode PE. For example, the first electrode CNE and the pixel electrode PE may be disposed on the third insulation layer 30. The first electrode CNE and the pixel electrode PE may be formed through the same process and may be formed of the same material.

The first electrode CNE may have at least one second hole CNE-H. For example, in the first electrode CNE, at least one second hole CNE-H may be defined in a portion overlapping the pixel defining film PDL. The second hole CNE-H may be provided in plurality. The second hole CNE-H may be filled with an insulation material, for example, the pixel defining film PDL.

In an embodiment, gas generated during a process may be discharged to the outside through the second holes CNE-H. For example, during the process, hydrogen may be generated in the first to third insulation layers 10, 20, and 30. When the hydrogen is not discharged, the hydrogen may be absorbed into a semiconductor layer of the gate driving circuit GDC. Hydrogen serves as a carrier, and thus, may cause defects in the gate driving circuit GDC. However, in an embodiment, hydrogen may be discharged to the outside through the second hole CNE-H serving as an out-gassing passage.

The first electrode CNE may be provided with a common voltage. Accordingly, noise generated between the clock signal lines CL and the input sensing lines TL may be blocked by the first electrode CNE. However, some of the second holes CNE-H may overlap at least some of the clock signal lines CL in a plan view. Accordingly, a clock signal applied to the clock signal lines CL is not shielded, so that noise may be generated in a signal applied to the input sensing lines TL. Particularly, in the case of a medium-sized display device such as a foldable display device, compared with a small-sized display device such as a cellphone, the width of the input sensing line TL is large, thereby greatly affected by a clock signal.

According to an embodiment of the inventive concept, the common electrode CE may cover a region in which the input sensing lines TL and the clock signal lines CL overlap in a plan view. The common electrode CE may prevent noise from being generated in a signal applied to the input sensing lines TL by a clock signal applied to the clock signal lines CL, and as a result, change in input sensitivity due to the noise may be prevented.

Meanwhile, the common electrode CE may be deposited using a mask. When forming the common electrode CE, because the mask and the display panel DP are spaced apart from each other, a shadow phenomenon occurs, so that an outer periphery portion of the common electrode CE, that is, a portion of the common electrode CE spaced far from the display region DA may be thinly deposited. Due to the common electrode CE thinly deposited, a signal provided to the clock signal lines CL may not be sufficiently shielded from a noise caused by the clock signal lines CL. In this case, noise may be generated in the input sense lines TL by a clock signal applied to the clock signal lines CL, and the input sensitivity may become not uniform.

The display panel DP according to an embodiment of the inventive concept includes a second electrode SE. The second electrode SE may be disposed above or below the common electrode CE. The second electrode SE may directly contact the common electrode CE. The second electrode SE may completely overlap at least some of the clock signal lines CL in a plan view.

The second electrode SE may be disposed on a portion vulnerable to the noise caused by the clock signal lines CL. For example, the second electrode SE may overlap the clock signal line CL overlapping the second holes CNE-H in a plan view among the clock signal lines CL. In addition, the thickness of the common electrode CE disposed on a clock signal line CL1 disposed farthest from the display region DA among the clock signal lines CL may be less than the thickness of the common electrode CE disposed on other clock signal lines CL2, CL3, and CL4. At this time, the second electrode SE may at least overlap the clock signal line CL1 disposed farthest from the display region DA in a plan view.

Since the second electrode SE is disposed overlapping the clock signal lines CL, a clock signal applied to the clock signal lines CL may be blocked by the second electrode SE, so that a phenomenon in which noise is generated in the input sensing lines TL may be prevented. That is, the second electrode SE may serve as a shielding electrode which blocks noise caused by the clock signal lines CL.

The second electrode SE may have conductivity. For example, the second electrode SE may include at least any one among a metal, a transparent conductive compound, and a conductive polymer. More preferably, the second electrode SE may be made of a transparent conductive layer such as an indium-zinc oxide (IZO). Since the second electrode SE has conductivity, a clock signal is effectively blocked, so that noise is effectively prevented from being generated in the input sensing lines TL. Accordingly, the input sensitivity of the input sensing layer TSL may become uniform.

The second electrode SE may be disposed on the pixel defining film PDL. For example, the second electrode SE may be disposed spaced apart from the first electrode CNE having the pixel defining film PDL interposed therebetween. Because the second electrode SE is disposed on the pixel defining film PDL, gas discharged by the second hole CNE-H may be smoothly discharged to the outside without being blocked by the second electrode SE.

As described above, the input sensing layer TSL may be disposed directly on the thin film encapsulation layer TFE. In this case, the input sensing lines TL and the clock signal lines CL are disposed closed to each other. Accordingly, the input sensing layer TSL is more affected by a clock signal, and noise may be more frequently generated in the input sensing layer TSL. However, since the display panel DP includes the second electrode SE in an embodiment, noise is blocked and uniform input sensitivity may be achieved.

Figure 10A:
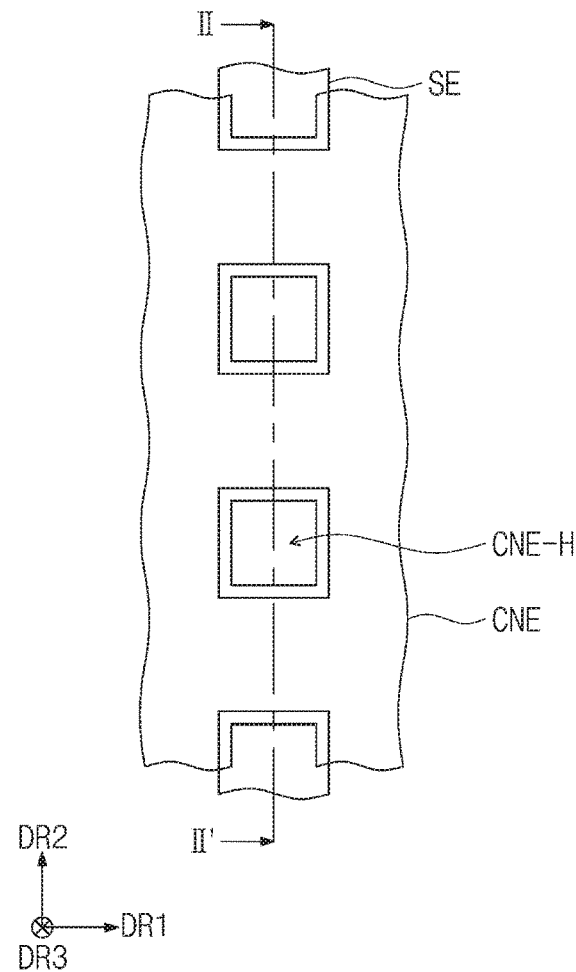
FIG. 10A is a plan view schematically illustrating a first electrode and a second electrode according to an embodiment of the inventive concept.
Figure 10B:
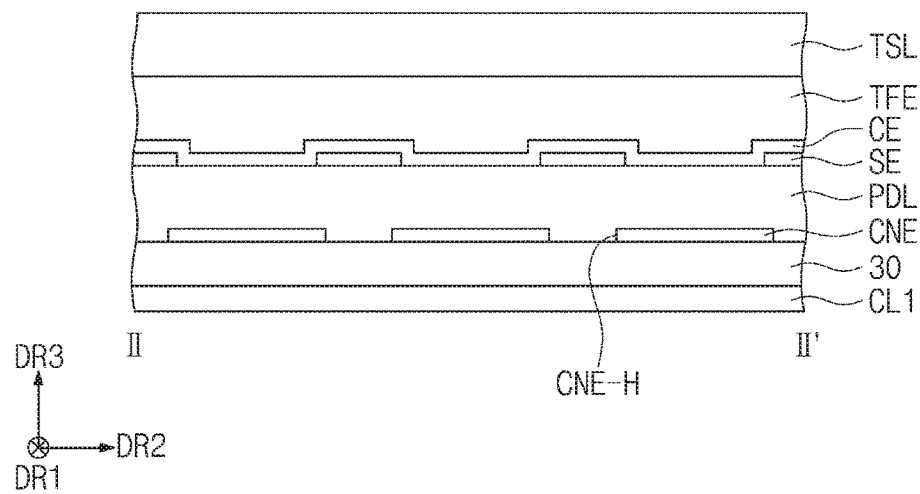
FIG. 10B is a cross-sectional view taken along line II-II' of FIG. 10A.
Figure 11A:
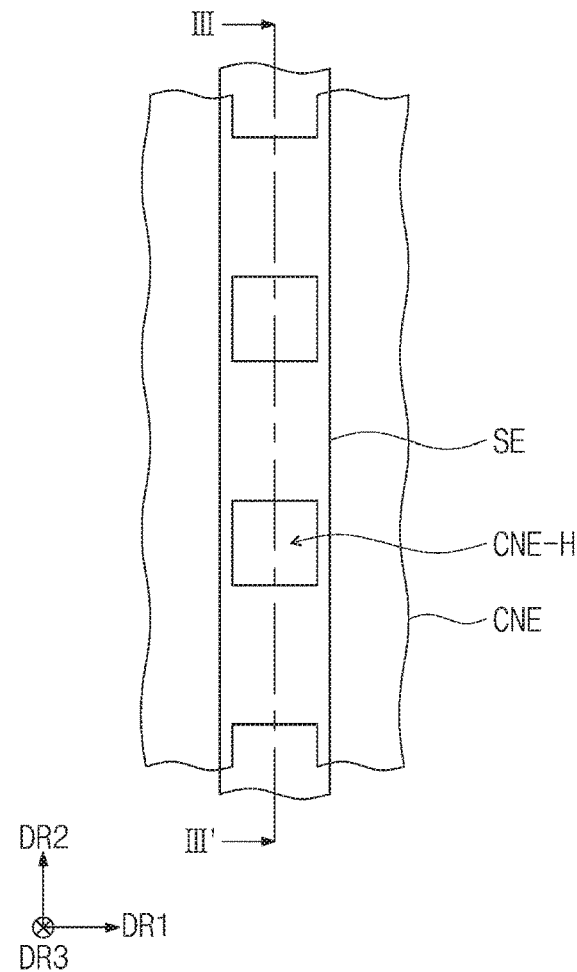
FIG. 11A is a plan view schematically illustrating a first electrode and a second electrode according to an embodiment of the inventive concept.
Figure 11B:
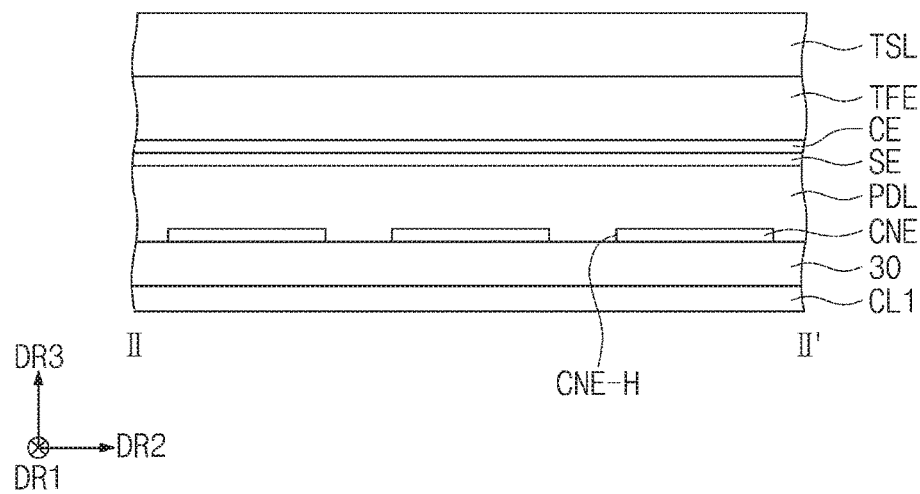
FIG. 11B is a cross-sectional view taken along line III-III' of FIG. 11A.

FIG. 10A is a plan view schematically illustrating the first electrode CNE and the second electrode SE according to an embodiment of the inventive concept. FIG. 10B is a cross-sectional view taken along line II-II' of FIG. 10A. FIG. 11A is a plan view schematically illustrating the first electrode CNE and the second electrode SE according to an embodiment of the inventive concept. FIG. 11B is a cross-sectional view taken along line III-III' of FIG. 11A.

In FIG. 10A, the first electrode CNE and the second electrode SE disposed on the first electrode CNE are schematically illustrated. As shown in FIG. 10A and FIG. 10B, the second electrode SE may be provided in plurality. The plurality of the second electrodes SE may correspond to each of the plurality of second holes CNE-H in a one-to-one correspondence. That is, each of the plurality of second electrodes SE may completely cover each of the plurality of second holes CNE-H. Accordingly, a signal not shielded by the second holes CNE-H may be blocked by the second electrode SE.

In FIG. 11A, the first electrode CNE and the second electrode SE disposed on the first electrode CNE are schematically illustrated. As shown in FIG. 11A and FIG. 11B, the second electrode SE may be provided as one body. The second electrode SE may be integrally provided to cover the plurality of second holes CNE-H.

The display device DD (see FIG. 1) according to an embodiment includes the second electrode SE overlapping at least some of the plurality of clock signal lines SL in a plan view. The second electrode SE may prevent noise from the clock signal lines SL from affecting the input sensing lines TL, and as a result, change in touch sensitivity due to the noise may be prevented. Accordingly, the display device DD may achieve uniform input sensitivity.

According to an embodiment of the inventive concept, a display device may include a second electrode. The second electrode may prevent noise from affecting input sensing lines, and thus, may provide an input sensing layer having uniform input sensitivity.

Although the inventive concept has been described with reference embodiments of the inventive concept, it will be understood by those skilled in the art that various modifications and changes in form and details may be made therein without departing from the spirit and scope of the inventive concept as set forth in the following claims. In addition, the embodiments disclosed in the inventive concept are not intended to limit the technical spirit of the inventive concept, and all technical concepts falling within the scope of the following claims and equivalents thereof are to be construed as being included in the scope of the inventive concept.

What is claimed is:

1. A display device comprising:
a display panel configured to display an image; and
an input sensing layer disposed on the display panel and including an input sensor and a plurality of input sensing lines electrically connected to the input sensor, wherein the display panel includes:
a base layer including a display region and a non-display region;
a first hole being surrounded by the display region in a plan view;
a circuit layer including a pixel circuit layer disposed on the base layer within the display region, and a driving circuit layer disposed on the non-display region of the base layer and including a power electrode and a plurality of clock signal lines and providing a driving signal configured to drive the pixel circuit layer;
a light emitting element layer including a pixel electrode disposed on the pixel circuit layer and electrically connected to the pixel circuit layer, a light emitting layer disposed on the pixel electrode, and a common electrode disposed on the light emitting layer and extended toward the non-display region from the display region, wherein the common electrode is disposed on a second electrode in the non-display region; and
a first electrode disposed between the plurality of clock signal lines and the plurality of input sensing lines and having a plurality of second holes defined therein; and
wherein the second electrode is spaced apart from the first electrode with a pixel defining film interposed therebetween and overlaps the first electrode and at least one of the plurality of clock signal lines in a plan view.

2. The display device of claim 1, wherein the at least one of the plurality of clock signal lines includes a clock signal line that is disposed farthest from the display region and the second electrode overlaps the clock signal line that is disposed farthest from the display region in a plan view.

3. The display device of claim 2, wherein the second electrode is provided in plurality and the plurality of second electrodes overlap the plurality of second holes in a one-to-one correspondence.

4. The display device of claim 1, wherein the first electrode electrically connects the power electrode and the common electrode.

5. The display device of claim 1, wherein the pixel defining film is disposed on the pixel electrode and exposes at least a portion of the pixel electrode.

6. The display device of claim 1, wherein the first electrode is disposed on the same layer with the pixel electrode.

7. The display device of claim 1, wherein the second electrode has conductivity.

8. The display device of claim 1, wherein the second electrode includes a transparent conductive layer.

9. The display device of claim 1, wherein the display panel further comprises a thin film encapsulation layer disposed on the light emitting element layer and the input sensing layer is directly disposed on the thin film encapsulation layer.

10. The display device of claim 1, wherein the first hole is defined by removing the components of the display panel and the input sensing layer.

11. The display device of claim 1, wherein the plurality of second holes are filled with an insulation material.

12. A display device comprising:
a base layer having a display region and a non-display region defined thereon;
a circuit layer including a driving circuit layer which is disposed on the base layer and includes a power electrode and a plurality of clock signal lines, and a pixel circuit layer;
a light emitting element layer disposed on the circuit layer and including a pixel electrode, a light emitting layer, and a common electrode sequentially laminated;
a pixel defining film which is disposed on the pixel electrode and exposes at least a portion of the pixel electrode; and
a second electrode disposed on the pixel defining film to be spaced apart from a first electrode with the pixel defining film interposed therebetween and overlapping the first electrode, and at least one of the plurality of clock signal lines in a plan view.

13. The display device of claim 12, wherein the first electrode electrically connects the power electrode and the common electrode and overlaps at least some of the plurality of clock signal lines, wherein the first electrode has a plurality of second holes defined therein, and the second electrode overlaps the plurality of second holes in a plan view.

14. The display device of claim 13, wherein the second electrode is provided in plurality, and the second electrodes respectively correspond to the plurality of second holes in a one-to-one correspondence.

15. The display device of claim 12, further comprising a thin film encapsulation layer disposed on the common electrode.

16. The display device of claim 15, further comprising an input sensing layer directly disposed on the thin film encapsulation layer and including an input sensor and a plurality of input sensing lines electrically connected to the input sensor,
wherein the second electrode is disposed between the input sensing lines and the plurality of clock signal lines.

17. The display device of claim 12, wherein the second electrode includes a transparent conductive layer.

18. The display device of claim 12, further comprising at least one first hole passing through the display region of the base layer.

19. The display device of claim 12, wherein the second electrode overlaps a clock signal line that is disposed farthest from the display region in a plan view.

* * * * *